United States Patent
Hammond et al.

(10) Patent No.: US 9,159,516 B2
(45) Date of Patent: Oct. 13, 2015

(54) ACTUATION SIGNAL FOR MICROACTUATOR BOUNCE AND RING SUPPRESSION

(75) Inventors: Jonathan Hale Hammond, Oak Ridge, NC (US); Philippe Gorisse, Brax (FR)

(73) Assignee: RF Mirco Devices, Inc., Greensboro, NC (US)

( * ) Notice: Subject to any disclaimer, the term of this patent is extended or adjusted under 35 U.S.C. 154(b) by 778 days.

(21) Appl. No.: 13/311,728

(22) Filed: Dec. 6, 2011

(65) Prior Publication Data

US 2012/0175230 A1 Jul. 12, 2012

Related U.S. Application Data

(60) Provisional application No. 61/431,692, filed on Jan. 11, 2011, provisional application No. 61/432,063, filed on Jan. 12, 2011.

(51) Int. Cl.
*H01H 59/00* (2006.01)
*H01H 1/00* (2006.01)

(52) U.S. Cl.
CPC ......... *H01H 59/0009* (2013.01); *H01H 1/0036* (2013.01); *Y10T 307/76* (2015.04)

(58) Field of Classification Search
CPC .......... H01H 59/0009; H01H 59/0018; H01H 2059/0018; H01H 2059/0063; H01H 1/0036; H01H 2001/0063; H01H 2001/0042; Y10T 307/74; Y10T 307/747; Y10T 307/753; Y10T 307/76
USPC .......... 307/112–115, 149; 361/207, 233, 234, 361/154; 200/181; 340/644
See application file for complete search history.

(56) References Cited

U.S. PATENT DOCUMENTS

| | | |
|---|---|---|
| 6,777,630 B1 | 8/2004 | Dove et al. |
| 7,071,432 B2 | 7/2006 | Lindsey |
| 7,106,066 B2 | 9/2006 | Ivanciw et al. |
| 7,135,766 B1 | 11/2006 | Costa et al. |
| 7,663,196 B2 | 2/2010 | Liu et al. |
| 7,999,643 B1 | 8/2011 | Dening et al. |
| 8,653,699 B1 | 2/2014 | Dening et al. |
| 2004/0257086 A1 | 12/2004 | Montrose et al. |

(Continued)

OTHER PUBLICATIONS

"Optimizing the Dynamic Response of RF MEMS Switches using Tailored Voltage Pulses", Published in the Thermanl, Mechanical and Multi-Physics Simulation Experimants in Microelectronics and Microsystems, 2007, EuroSime 2007, Date of Conference Apr. 16-18, 2007, Leus et al.*

(Continued)

*Primary Examiner* — Fritz M Fleming
(74) *Attorney, Agent, or Firm* — Withrow & Terranova, P.L.L.C.

(57) ABSTRACT

The present disclosure provides a system and method for controlling positioning of a movable member of a MEMS microactuator to reduce bouncing and ringing. The system includes control circuitry in communication with the MEMS microactuator. The control circuitry is adapted to linearly increase an actuation signal from a first state to a second state to urge the movable member from a first position to a second position and hold the movable member in the second position. The control circuitry is further adapted to linearly decrease the actuation signal from the second state to the first state to release the movable member to the first position. A transition time is not less than the inverse of one quarter of a natural frequency of the movable member as the movable member moves to the first position.

22 Claims, 6 Drawing Sheets

(56) References Cited

U.S. PATENT DOCUMENTS

| | | | |
|---|---|---|---|
| 2005/0096878 A1 | 5/2005 | Ivanciw et al. |
| 2005/0167047 A1 | 8/2005 | Huff et al. |
| 2006/0012014 A1 | 1/2006 | Chen et al. |
| 2006/0033594 A1 | 2/2006 | Lutz et al. |
| 2006/0108675 A1 | 5/2006 | Colgan et al. |
| 2006/0112014 A1 | 5/2006 | Azeem |
| 2007/0090902 A1 | 4/2007 | Deligianni et al. |
| 2007/0103028 A1 | 5/2007 | Lewis et al. |
| 2007/0172975 A1 | 7/2007 | Tomomatsu et al. |
| 2007/0281381 A1 | 12/2007 | Ayazi |
| 2008/0164542 A1 | 7/2008 | Yang et al. |
| 2008/0169707 A1 | 7/2008 | Wright et al. |
| 2010/0022053 A1 | 1/2010 | Mund et al. |

OTHER PUBLICATIONS

"Optimising Dynamic Behaviour of Electrostatically Actuated MEMS Contact Switch", Lishchynska et al., 978-1-4244-4161-7/09/$25.00, copyright 2009 IEEE. 10th Int. Conf. on Thermal, Mechanical and Multiphysics Simulation and Experiments in Micro-Electronics and Micro-systems, EuroSimE 2009.*
Abstract for Leus et al. showing publication date (from IEEE).*
Abstract for Leus et al. showing publication date (from IEEE), 2007.*
Notice of Allowance for U.S. Appl. No. 12/117,976 mailed Feb. 15, 2013, 5 pages.
Decision on Appeal for U.S. Appl. No. 12/118,031 mailed Apr. 7, 2014, 7 pages.
Non-final Office Action for U.S. Appl. No. 12/117,976 mailed Dec. 18, 2012, 10 pages.
Notice of Allowance for U.S. Appl. No. 12/117,643, mailed Oct. 9, 2013, 9 pages.
Non-final Office Action for U.S. Appl. No. 12/129,928 mailed Oct. 27, 2010, 10 pages.
Notice of Allowance for U.S. Appl. No. 12/129,928 mailed Mar. 31, 2011, 11 pages.
Non-final Office Action for U.S. Appl. No. 12/117,976 mailed Dec. 22, 2010, 8 pages.
Final Office Action for U.S. Appl. No. 12/117,976 mailed May 3, 2011, 11 pages.
Non-final Office Action for U.S. Appl. No. 12/117,976 mailed Sep. 14, 2011, 12 pages.
Advisory Action for U.S. Appl. No. 12/117,976 mailed Mar. 14, 2012, 6 pages.
Non-final Office Action for U.S. Appl. No. 12/118,031 mailed Dec. 23, 2010, 11 pages.
Final rejection for U.S. Appl. No. 12/118,031 mailed Apr. 26, 2011, 15 pages.

Wohlmuth, W. et al., "E-/D-pHEMT technology for wireless components," IEEE Compound Semiconductor Integrated Circuit Symposium, Oct. 24-27, 2004, pp. 115-118.
Costa, J. et al., "A silicon RFCMOS SOI technology for integrated cellular/WLAN RF TX modules," International IEEE/MTT-S Microwave Symposium, Honolulu, HI, Jun. 3-8, 2007, pp. 445-448.
Guan, L. et al., "A fully integrated SOI RF MEMS technology for system-on-a-chip applications," IEEE Transactions on Electron Devices, Jan. 2006, pp. 167-172, vol. 53, No. 1.
Shokrani, M. et al., "InGaP-Plus: a low cost manufacturable GaAs BiFET Process Technology," CS Mantech Conference, Apr. 24-27, 2006, Vancouver, British Columbia, Canada, pp. 153-156.
Joseph, A. et al., "A 0.35µm SiGe BiCMOS technology for power amplifier applications," Bipolar/MiCMOS Circuits and Technology Meeting 2007, IEEE, Sep. 30-Oct. 2, 2007, pp. 198-201.
Kelly, D. et al., "The state-of-the art of silicon-on-sapphire CMOS RF switches," Compound Semiconductor Integrated Circuit Symposium, Oct. 30-Nov. 2, 2005, 4 pages.
Mazure, C. et al., "Engineering wafers for the nanotechnology era," Proceedings of the 35th European Solid-State Device Research Conference, Sep. 12-16, Grenoble, France, 2005, pp. 29-38.
Czaplewski, David A. et al., "A Soft-Landing Waveform for Actuation of a Single-Pole Single-Throw Ohmic RF MEMS Switch," Journal of Microelectromechanical Systems, Dec. 2006, pp. 1586-1594, vol. 15, No. 6, IEEE.
McCarthy, Brian et al., "A Dynamic Model, Including Contact Bounce, of an Electrostatically Actuated Microswitch," Journal of Microelectromechanical Systems, Jun. 2002, pp. 276-283, vol. 11, No. 3.
Rebeiz, G., "RF MEMS Theory, Design and Technology," Wiley-Interscience, Jun. 15, 2002, pp. 193, Figure 7.10.
Tinella, C. et al., "0.13µm CMOS SOI SP6T Antenna Switch for Multi-Standard Handsets," Silicon Monolithic Integrated Circuits in RF Systems, Jan. 2006, pp. 58-61.
Tombak, A. et al., "A flip-chip silicon IPMOS power amplifier and a DC/DC convertor for GSM 850/900/1800/1900 MHz Systems," IEEE Radio Frequency Integrated Circuits Symposium, Jun. 3-5, 2007, pp. 79-82.
Costa, J. et al., "Integrated MEMS Switch Technology on SOI-CMOS," Proceedings of Hilton Head Workshop 2008: A Solid State Sensors, Actuators and Microsystems Workshop, 4 pages.
Advisory Action for U.S. Appl. No. 12/118,031, mailed Jun. 2, 2011, 4 pages.
Examiner's Answer for U.S. Appl. No. 12/118,031, mailed Nov. 3, 2011, 17 pages.
Non-Final Office Action for U.S. Appl. No. 12/129,928, mailed May 12, 2010, 8 pages.

* cited by examiner

ACTUATION SIGNAL FOR MICROACTUATOR BOUNCE AND RING SUPPRESSION

This application claims the benefit of U.S. provisional patent application Ser. No. 61/431,692 filed Jan. 11, 2011 and U.S. provisional patent application Ser. No. 61/432,063 filed Jan. 12, 2011, the disclosures of which are incorporated herein by reference in their entireties.

CROSS-REFERENCE TO RELATED APPLICATIONS

This application is related to U.S. patent application Ser. No. 12/117,976 entitled CONTROLLED CLOSING OF MEMS SWITCHES filed May 9, 2008, now U.S. Pat. No. 8,653,699, and U.S. patent application Ser. No. 12/118,031 entitled CONTROLLED OPENING OF MEMS SWITCHES filed May 9, 2008, now abandoned, both of which are incorporated herein by reference in their entireties, and form part of the specification and teachings herein.

FIELD OF THE DISCLOSURE

The present disclosure relates to micro-electro-mechanical system (MEMS) microactuators, and in particular to controlling actuation of MEMS microactuators to improve performance.

BACKGROUND OF THE DISCLOSURE

As electronics evolve, there is an increased need for miniature switches and microactuators that are provided on semiconductor substrates along with other semiconductor components to form various types of circuits. These miniature switches often act as relays, and are generally referred to as micro-electro-mechanical system (MEMS) switches. In many applications, MEMS switches may replace field effect transistors (FETs), and are configured as switches to reduce insertion losses due to added resistance, to reduce parasitic capacitance and inductance, and to reduce signal distortion inherent in providing FET switches in a signal path. MEMS switches are currently being considered in many radio frequency (RF) applications, such as antenna switches, mode switches, transmit/receive switches, switches in tunable networks, and the like.

Turning to FIGS. 1A and 1B, a MEMS device 10 having a MEMS switch 12 is illustrated according to one embodiment of the present disclosure. The MEMS switch 12 is formed on an appropriate substrate 14. The MEMS switch 12 includes a movable member, such as a cantilever 16, which is formed from a conductive material, such as gold. The cantilever 16 has a first end and a second end. The first end is coupled to the substrate 14 by an anchor 18. The first end of the cantilever 16 is also electrically coupled to a first conductive pad 20 at or near the point where the cantilever 16 is anchored to the semiconductor substrate 14. Notably, the first conductive pad 20 may play a role in anchoring the first end of the cantilever 16 to the semiconductor substrate 14 as depicted.

The second end of the cantilever 16 forms or is provided with a cantilever contact 22, which is suspended over a contact portion 24 of a second conductive pad 26. Thus, when the MEMS switch 12 is actuated, the cantilever 16 moves the cantilever contact 22 into electrical contact with the contact portion 24 of the second conductive pad 26 to electrically connect the first conductive pad 20 to the second conductive pad 26. The MEMS switch 12 may be encapsulated by one or more encapsulating layers 30, which form a substantially hermetically sealed cavity about the cantilever 16. The cavity is generally filled with an inert gas and may be sealed in a near vacuum state. Once the encapsulation layers 30 are in place, an overmold material 32 may be provided over the encapsulation layers 30 as part of a high volume packaging process. It is to be understood that a movable member having a fixed end and a free end such as cantilever 16 is but one type of configuration for a microactuator. Various types of microactuators known to those skilled in the art can have movable members that are fixed at more than one point or end.

To actuate the MEMS switch 12, and in particular to cause the cantilever 16 to move the cantilever contact 22 into contact with the contact portion 24 of the second conductive pad 26, an actuator plate 28 is disposed over a portion of the substrate 14 and under the middle portion of the cantilever 16. To actuate the MEMS switch 12, an electrostatic voltage is applied to the actuator plate 28. The presence of the electrostatic voltage over time creates a force that moves the metallic cantilever 16 toward the actuator plate 28, thus moving the cantilever 16 from the position illustrated in FIG. 1A to the position illustrated in FIG. 1B.

Problematically, actuation of a MEMS switch 12, especially one maintained at near vacuum conditions, results in the cantilever 16 moving toward contact portion 24 with a momentum sufficient to cause the cantilever contact 22 to bounce one or more times off of the contact portion 24 of the second conductive pad 26 after initial contact. Such bouncing degrades circuit performance and effectively increases the closing time. The article entitled "A Dynamic Model, Including Contact Bounce, of an Electrostatically Actuated Microswitch," by Brian McCarthy et al., provides a detailed analysis of this bouncing phenomenon and is incorporated herein by reference. The dynamic closing forces may also be sufficient to damage both the contact portion 24 of the second conductive pad 26 as well as the cantilever contact 22, thus causing excessive wear, which results in a shortened operating life for the MEMS switch 12.

As a result, efforts have been made to control the speed with which the cantilever 16 moves cantilever contact 22 toward the contact portion 24 of the second conductive pad 26 at the moment of contact to reduce bouncing. In particular, an actuation signal having a special waveform is initially applied to the actuator plate 28. The actuation signal moves the cantilever 16 downward, such that the contact pad 22 at the end of the cantilever 16 initially moves rapidly toward the contact portion 24 of the second conductive pad 26. The actuation signal is configured such that the effective electrostatic voltage is reduced or removed prior to the cantilever contact 22 coming into contact with the contact portion 24 of the second conductive pad 26. The downward momentum will continue to move the cantilever 16 downward, albeit at a decreasing rate, wherein the contact pad 22 lands softly and slowly on the contact portion 24 of the second conductive pad 26. Once the MEMS switch 12 is closed, a hold signal is applied to actuator plate 28 to hold the cantilever 16 in a closed position such that the contact pad 22 is held in contact with the contact portion 24 of the second conductive pad 26. The article "A Soft-Landing Waveform for Actuation of a Single-Pole Single-Throw Ohmic RF MEMS Switch," by David A. Czaplewski et al., provides a technique for providing a pre-determined actuation signal to control the closing of a MEMS switch 12 and is incorporated herein by reference.

Providing an actuation signal to effect soft closings of the MEMS switches 12 theoretically reduces bouncing and increases the operating life of the device. In practice however, process variation in the switch manufacture will reduce or eliminate the efficiency of a waveform to effect soft closing as described. Circuits which can adapt to this process variation in the switch manufacture have been proposed but these represent additional cost and complexity. Accordingly, there is a need for a technique to reduce or eliminate bouncing in MEMS switches 12 over process variations and operating conditions using simple waveforms and circuits.

MEMS switches 12 also have issues associated with being released from a closed position, or opening. The cantilever 16 can be effectively a metallic beam, which is deflected when the MEMS switch 12 is closed and is suspended in a natural state when the MEMS switch 12 is open. Releasing the MEMS switch 16 entails turning off the hold signal, and thus releasing the deflected cantilever 16 from the closed position. Once released the cantilever 16 springs upward and begins mechanically oscillating up and down. Such mechanical oscillation is referred to as ringing, and in a cavity in a near vacuum state this ringing may continue for an extended period of time. Such ringing may degrade circuit performance and effectively increases the opening time. Further, the magnitude and time of ringing may vary over various operating conditions and process variations.

If the cantilever 16 is still ringing when the next actuation signal is applied, the nominal actuation signal may not provide a bounce free closing given the cantilever's position, upward momentum, downward momentum, or a combination thereof. Accordingly, there is a further need for a technique to reduce or eliminate ringing of MEMS switches 12 over various operating conditions and process variations using simple waveforms and circuits. More generally, there is a need for a technique to suppress bouncing and ringing of movable members of MEMS microactuators that include MEMS switches, but also include MEMS capacitors and microscopic servomechanisms.

Summary of the Disclosure

The present disclosure provides a system and method for controlling positioning of a movable member of a microelectro-mechanical system (MEMS) microactuator to reduce bouncing and ringing. The system includes a MEMS microactuator having a movable member relative to a fixed member, which is fixed to a substrate on which the MEMS microactuator resides. For example, in one embodiment, the MEMS microactuator is a MEMS switch, and the movable member is a cantilever. The system also includes control circuitry in communication with the MEMS microactuator, wherein the control circuitry is adapted to execute a method that increases an actuation signal from a first state to a second state to urge the movable member from a first position to a second position and hold the movable member in the second position. A rate of increase in the actuation signal is a positive slope with the lowest possible magnitude which will ensure full compliance with the predetermined application specification in the time allotted by that specification as the movable member moves from a first position to the second position. Using the lowest possible slope magnitude will ensure that the closing occurs with the smallest possible momentum and therefore will create the least possible amount of bouncing when using the simple positive slope waveform. For the purpose of this disclosure slope is defined as rise over run, At some point, it is desirable to return the movable member to the first position. Therefore, the control circuitry is further adapted to decrease the actuation signal from the second state to the first state to release the movable member to the first position. In at least one embodiment, the rate of decrease for the actuation signal between the second state and the first state has a slope with a transition time that is not less than the inverse of one quarter of a natural frequency of the member in the first position as the movable member transitions from the second position to the first position.

In another embodiment, the control circuitry is further adapted to decrease the actuation signal from the second state to a third state to release the movable member to a third position and decrease the actuation signal from the third state to the first state to release the movable member to the first position. In this embodiment, the rate of decrease for the actuation signal from the second state to the third state can be as fast as or not less than the inverse of a quarter of a fixed-fixed natural mechanical frequency in which the both ends of the movable member are fixed. An example of a fixed-fixed movable member is a closed MEMS switch in which one end of the movable member is anchored and the other end has a contact that is firmly closed against a contact plate. In at least one embodiment, the rate of decrease for the actuation signal between the third state and the first state has a slope with a transition time that is not less than the inverse of one quarter of a natural frequency of the movable member in the first position as the movable member transitions from the from the third position to the first position.

In yet another embodiment, the control circuitry is further adapted to hold the movable member in the third position before decreasing the actuation signal between the third state and the first state. In this way energy stored in the movable member is further dissipated before proceeding from the third position to the first position.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

For the purposes of the present disclosure, directional terms such as "front", "back", "top", "bottom", "above", "below", "left", "right", "horizontal", "vertical", "up", "down", "upward", "downward", etc. are merely used for convenience in describing the various embodiments of the present disclosure. It is to be understood that the embodiments of the present disclosure may be oriented in various ways.

Figure 2:
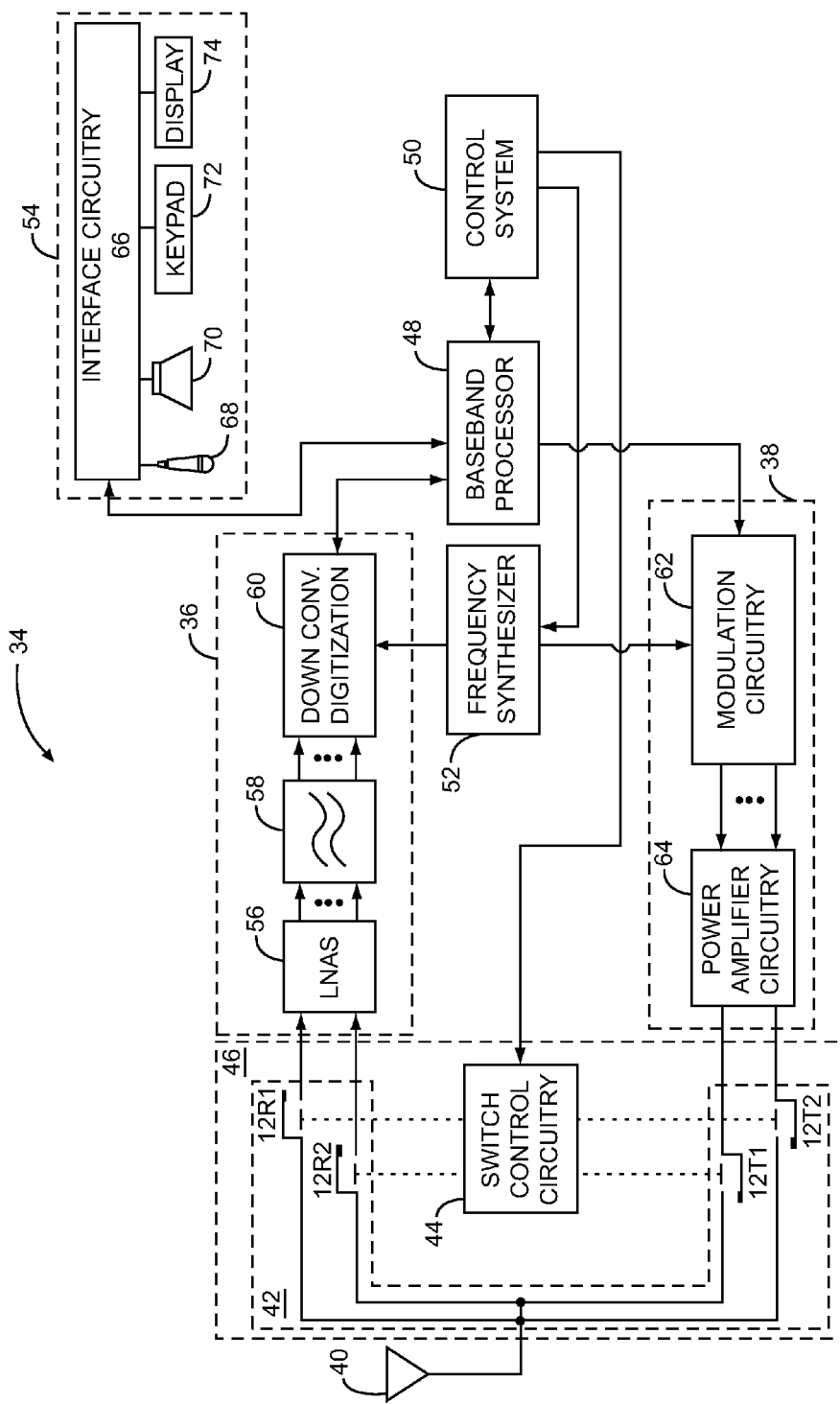
FIG. 2 is a block representation of a mobile terminal according to one embodiment of the present disclosure.

The system and method of the present disclosure may be incorporated in a mobile terminal, such as a mobile telephone, wireless personal digital assistant, or like communication device, in various ways. In many applications, MEMS switches 12 are being deployed as antenna switches, mode switches, transmit/receive switches, switches in tunable networks and the like. FIG. 2 illustrates an exemplary embodiment where numerous MEMS switches 12 are employed in a transmit/receive switch of a mobile terminal 34. Prior to delving into the details of the disclosure, an overview of the basic architecture of the mobile terminal 34 is provided.

As illustrated in FIG. 2, the mobile terminal 34 may include a receiver front end 36, a transmitter section 38, an antenna 40, and a transmit/receive switch 42, which includes four active MEMS switches 12R1, 12R2, 12T1, and 12T2. When the transmit/receive switch 42 is combined with a switch control circuitry 44, a system 46 is realized for controlling the positioning of movable members such as cantilever 16 (FIG. 1) of each of the four active MEMS switches 12R1, 12R2, 12T1, and 12T2. The mobile terminal 34 is capable of operating in two different bands while using the single antenna 40. As such, both the receiver front end 36 and the radio frequency transmitter section 38 are coupled to the antenna 40 through two different paths. Each path includes one of the active MEMS switches 12R1, 12R2, 12T1, and 12T2.

When receiving in the first band, the active MEMS switch 12R1 is closed, while the other active MEMS switches 12R2, 12T1, and 12T2 are open. When transmitting in the first band, the active MEMS switch 12T1 is closed, while the active MEMS switches 12R1, 12R2, and 12T2 are open. When receiving in the second mode, active MEMS switch 12R2 is closed, while the other active MEMS switches 12R1, 12T1, and 12T2 are open. Similarly, when transmitting in the second mode, active MEMS switch 12T2 is closed while the other active MEMS switches 12R1, 12R2, and 12T1 are open. Thus, signals received by or transmitted from the antenna 40 are selectively routed between the receiver front end 36 and the radio frequency transmitter section 38 based on the selected band. Control of the active MEMS switches 12R1, 12R2, 12T1, and 12T2 is provided by the switch control circuitry 44, which provides actuation signals to the actuator plates 28 (FIGS. 1A and 1B) to provide a bounce suppressed closing of the active MEMS switch 12, and when the active MEMS switch 12 is closed, provide the signal applied to the actuator plate 28 to effectively hold the active MEMS switch 12 in a firmly closed position. The actuation signal is decreasingly removed from the actuator plate 28 of the active MEMS switch 12 that is closed to allow the active MEMS switch 12 to return to its normal resting (open) position.

As will be described in greater detail below, the switch control circuitry 44 will provide actuation signals to the active MEMS switches 12R1, 12R2, 12T1, and 12T2. In particular, the switch control circuitry 44 will provide an actuation signal that increases from a first state to a second state to urge the movable member, in this case, the cantilever 16 from a first position to a second position while at the same time minimizing bouncing, which is normally associated with a MEMS switch 12 closing from an opened position. In this case, the first position is associated with a switch open state and the second position is associated with a switch closed state.

In addition to providing an appropriate actuation signal to the active MEMS switches 12R1, 12R2, 12T1, and 12T2, the switch control circuitry 44 may also provide a decreasing actuation signal, which is configured to reduce or minimize ringing, which is normally associated with a MEMS switch 12 opening from a closed position. Further detail relating to controlling bouncing and ringing is provided below after the remaining overview of the basic architecture of the mobile terminal 34.

Continuing with FIG. 2, the mobile terminal 34 further includes a baseband processor 48, a control system 50, a frequency synthesizer 52, and an interface 54. The control system 50 may include or cooperate with the switch control circuitry 44 to control the active MEMS switches 12R1, 12R2, 12T1, and 12T2 to facilitate receiving and transmitting via the different modes as well as help suppress bouncing and ringing of the active MEMS switches 12R1, 12R2, 12T1, and 12T2 during closing and opening, respectively.

The receiver front end 36 receives information bearing radio frequency signals of a given mode from one or more remote transmitters provided by a base station (not shown). Low noise amplifiers 56 amplify the signal. Filter circuits 58 minimize broadband interference in the received signal, while downconversion and digitization circuitry 60 downconverts the filtered, received signal to an intermediate or baseband frequency signal, which is then digitized into one or more digital streams. The receiver front end 36 typically uses one or more mixing frequencies generated by the frequency synthesizer 52. The baseband processor 48 processes the digitized received signal to extract the information or data bits conveyed in the received signal. This processing typically comprises demodulation, decoding, and error correction operations. As such, the baseband processor 48 is generally implemented in one or more digital signal processors (DSPs).

On the transmit side, the baseband processor 48 receives digitized data, which may represent voice, data, or control information, from the control system 50, which it encodes for transmission. The encoded data is output to the radio frequency transmitter section 38, where it is used by modulation circuitry 62 to modulate a carrier signal that is at a desired transmit frequency for the given mode. Power amplifier circuitry 64 amplifies the modulated carrier signal to a level appropriate for transmission according to a power control signal, and delivers the amplified and modulated carrier signal to antenna 40 through the transmit/receive switch 42.

A user may interact with the mobile terminal 34 via the interface 54, which may include interface circuitry 66, which is generally associated with a microphone 68, a speaker 70, a keypad 72, and a display 74. The microphone 68 will typically convert audio input, such as the user's voice, into an electrical signal, which is then digitized and passed directly or indirectly to the baseband processor 48. Audio information encoded in the received signal is recovered by the baseband processor 48, and converted by the interface circuitry 66 into an analog signal suitable for driving the speaker 70. The keypad 72 and display 74 enable the user to interact with the mobile terminal 34, input numbers to be dialed, address book information, or the like, as well as monitor call progress information.

Figure 3:
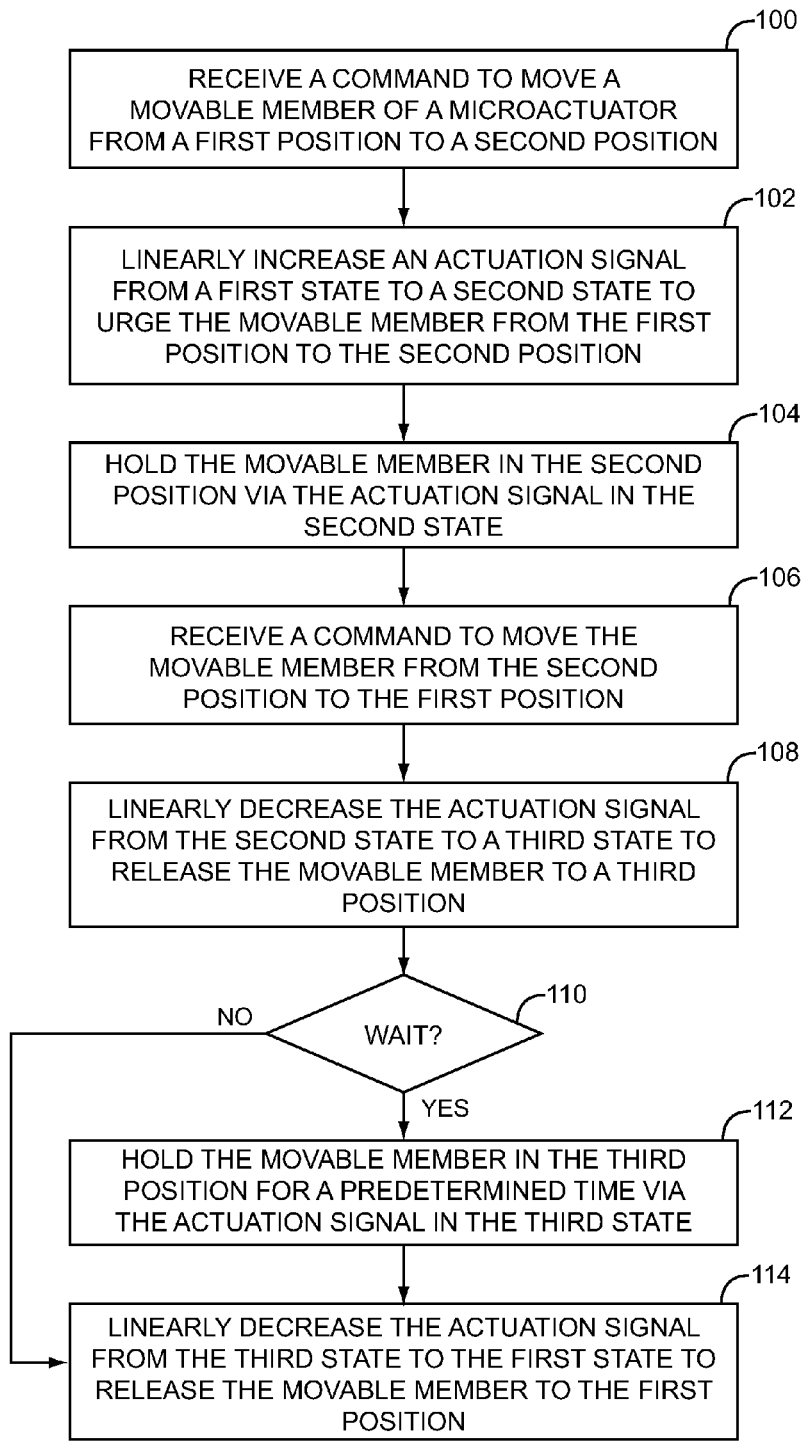
FIG. 3 is a flow diagram illustrating a method that provides an actuation signal according to one embodiment of the present disclosure.

With reference to FIG. 3, a method is provided for providing an appropriate actuation signal to use when closing the active MEMS switches 12R1, 12R2, 12T1, and 12T2. In particular, the method provides linearly increasing the actuation such that bouncing is minimized using a first linear voltage ramp having a positive slope with a magnitude defined by a rise which is a difference between the second signal state and the first signal state and a run which is a difference between a time that a predetermined application requires for the movable member to nearly reach the second position and the start of the linear voltage ramp. In the following operational example, a movable member is the cantilever 16 (FIG. 1) of a microactuator that is a selected one of the active MEMS switches 12R1, 12R2, 12T1, and 12T2.

Figure 1A:
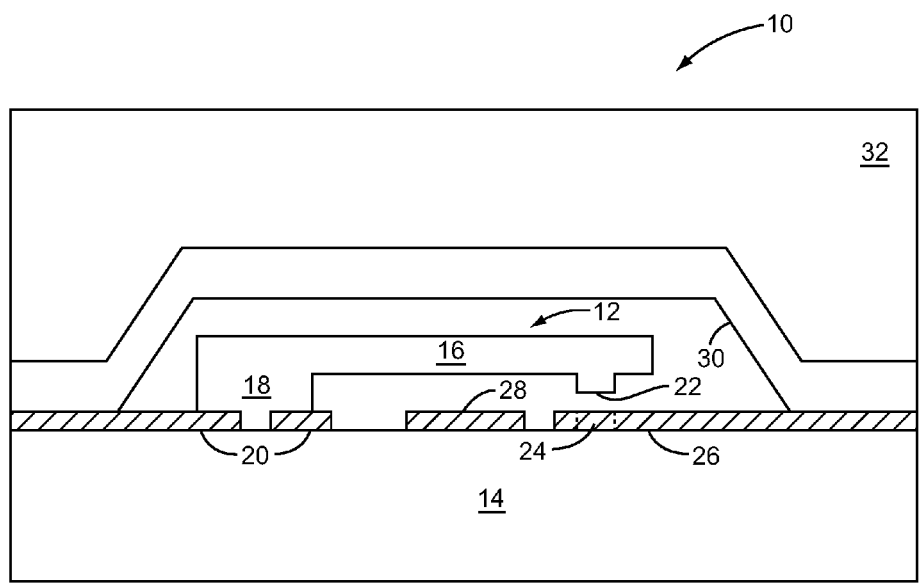
FIGS. 1A and 1B illustrate an exemplary micro-electromechanical system (MEMS) switch in a resting and closed position, respectively.
Figure 1B:
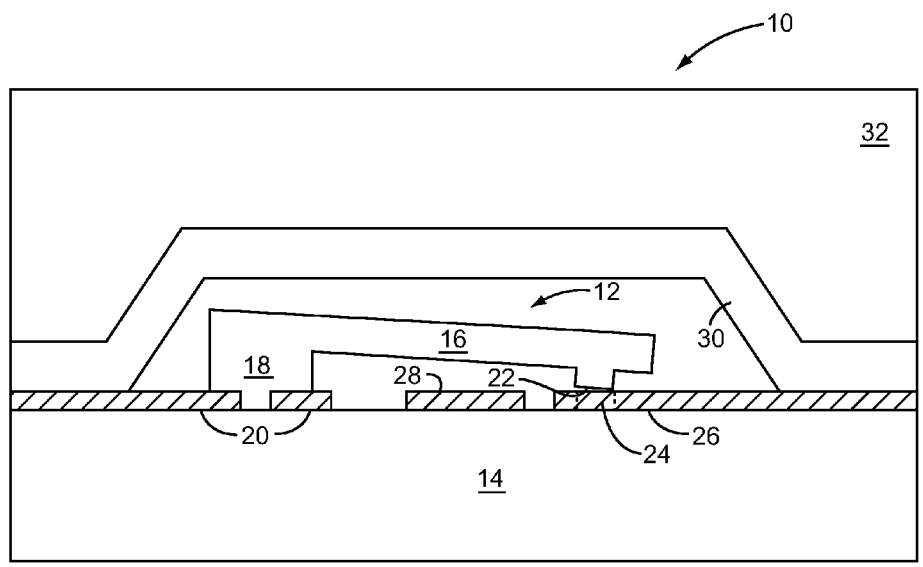

The following discussion refers to the operation of the MEMS switch 12 depicted in FIGS. 1A and 1B. However, it is to be understood that the actuation signal of the present disclosure is usable to actuate MEMS microactuators of types other than the MEMS switch 12. Other types of MEMS microactuators include but are not limited to MEMS capacitors and microscopic servomechanisms. The movable member of the MEMS switch 12 is the cantilever 16, whereas the movable member of a MEMS capacitor is typically a deflectable capacitor plate that has a first position for minimum capacitance and a second position for maximum capacitance. The movable member of a microscopic servomechanism is typically a servo arm having a first position that is a retracted position and a second position that is an extended position. It is to be understood that the concept could apply to any microactuator structure.

In operation, the switch control circuitry 44 will receive a command from the control system 50 (FIG. 2) to move the movable member (e.g., cantilever 16 FIGS. 1A and 1B) of the microactuator (e.g., MEMS switch 12 FIGS. 1A and 1B) from a first position to a second position (step 100). In response to the command, the switch control circuitry 44 increases an actuation signal from a first state to a second state to urge the movable member from the first position to the second position (step 102). In particular, a rate of increase in the actuation signal is a positive slope with the lowest possible magnitude which will ensure full compliance with the predetermined application specification in the time allotted by that specification as the movable member moves from a first position to the second position. The movable member is then held in the second position via the actuation signal in the second state (step 104). At some point, the switch control circuitry 44 will receive a command to move the movable member from the second position to the first position (step 106). In response to this command, the switch controller decreases the actuation signal from the second state to a third state to release the movable member to a third position (step 108). A time to decrease for the actuation signal from the second state to the third state should not be less than the inverse of a quarter of the natural frequency of the cantilever 16 in a closed state. In some cases, it can be helpful to wait for a predetermined time to allow the movable member and the microactuator to dissipate stored energy (step 110). As such, the switch control circuitry 44 will hold the movable member in the third position via the actuation signal in the third state for a predetermined time (step 112). After the predetermined time expires, the switch control circuitry 44 will decrease the actuation signal from the third state to the first state to release the movable member to the first position (step 114). The time to linearly decrease the actuation signal from the third state to the first state should not be less than the inverse of one quarter of the natural frequency of the cantilever in an open state.

Figure 4:
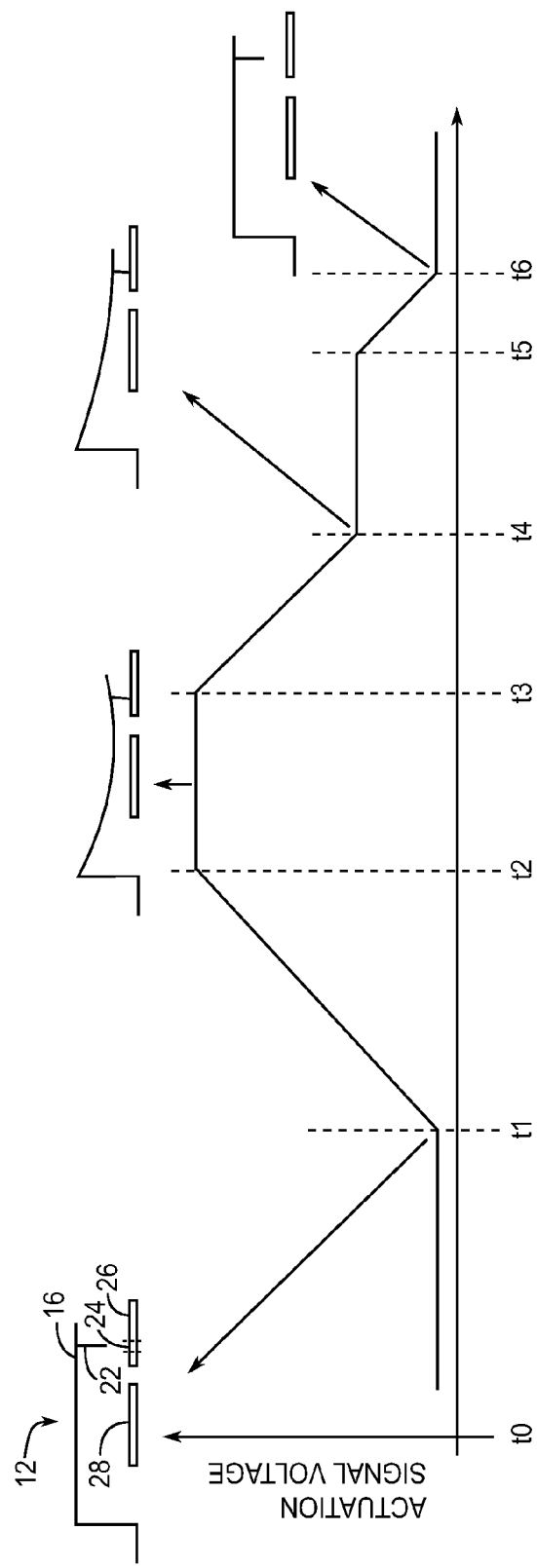
FIG. 4 is a graph of voltage versus time for the actuation signal in response to the method described in the flow diagram of FIG. 3.

FIG. 4 is a graph of voltage versus time for the actuation signal of the present disclosure. Symbols representing states of the MEMS switch 12 in response to the actuation signal are depicted above the graph in FIG. 4. It is to be understood that MEMS switch 12 is used for illustrative purposes and that other types of microactuators will respond similarly to the actuation signal of the present disclosure.

At a time t0, the voltage of the actuation signal is near zero and the MEMS switch 12 is in a first position, which in this case is an open position wherein the cantilever 16 does not store any appreciable mechanical energy. The voltage of the actuation signal increases at a predetermined slowest rate between a time t1 and a time t2. In particular, the predetermined slowest rate is the slowest rate of voltage increase of the actuation signal that is needed for a predetermined application.

The period between the time t1 and the time t2 is referred to as the ramp-up time of the actuation signal. Increasing the actuation signal is achieved using a first linear voltage ramp having a positive slope that is relatively simple to realize using the switch control circuitry 44 (FIG. 2). Moreover, the positive slope is predetermined to minimize the momentum of the cantilever 16 and the contact 22 at the instant the contact 22 touches the second conductive pad 26. Minimizing this momentum ensures the least possible amount of bouncing and the shortest possible settling time to a firmly closed second position.

At the end of the ramp-up time at time t2, the cantilever 16 is in the second position which brings the cantilever contact 22 firmly against the contact portion 24 of the second conductive pad 26. The actuation signal is now in the second state which voltage at least above and preferably significantly above the voltage needed to just achieve contact. This extra voltage provides extra force to hold the two portions together firmly. At this point the MEMS switch 12 is in firm contact, which is illustrated by a relatively deep arc of the cantilever 16. It is important to note that the MEMS switch 12 is not drawn to scale. Therefore, movable members such as the cantilever 16 may have more or less deflection for firm contact and still be within the scope of the present disclosure.

The ramp-up time is proportional to a "switch on" time and is inversely proportional to a momentum of the cantilever 16. In one embodiment, the ramp-up time is around 20 μS. Other ramp-up times can be shorter or longer depending upon the mechanical characteristics of the MEMS switch 12 and the requirement of the predetermined application for the MEMS switch or micro-actuator. For example, the mechanical stiffness of the cantilever 16 may be different for different embodiments of the MEMS switch 12. Also, different embodiments may hermetically seal the MEMS switch 12 in various gas environments that have differing influences on mechanical damping of the cantilever 16.

During a time period between the time t2 and a time t3, the actuator signal maintains a voltage needed to hold the cantilever contact 22 in firm contact with the contact portion 24 of the second conductive pad 26. In the case of firm contact, there is sufficient contact force to achieve the low insertion loss expected of a MEMS switch. Typically, the mechanical energy stored in the cantilever 16 will be at a maximum while the cantilever contact 22 is in firm contact with the contact portion 24 of the second conductive pad 26. As a result of the mechanical energy stored in the cantilever 16, an abrupt and significant decrease in the voltage of the actuation signal below the release voltage to release the cantilever 16 to the open position of the MEMS switch 12 will generate an undesirable ringing displacement of the cantilever 16.

In one embodiment of the present disclosure, the undesirable ringing displacement of the cantilever 16 after release is dampened by dissipating a significant amount of the mechanical energy stored in the cantilever 16 during a holding period between the time t4 and the time t5. The potential mechanical energy stored in the cantilever 16 decreases by a reduction of the deformation in the cantilever 16 by decreasing the voltage of the actuation signal by an amount needed to release the cantilever contact 22 from firm contact with the contact portion 24 of the second conductive pad 26 to soft contact with the contact portion 24 of the second conductive pad 26. The reduction in the actuation signal voltage occurs between the time t3 and a time t4, which is referred to as the relaxing time. In particular, decreasing the actuation signal from the second state to a third state is achieved using a second linear voltage ramp having a first negative slope. At the time t4 the actuation signal is in the third state and the cantilever 16 is in a third position in which the cantilever contact 22 is in soft contact with the contact portion 24 of the second conductive pad 26. The relaxing time can be shorter than the ramp-up time. In one embodiment, the largest magnitude of the negative slope recommended for this relaxing time is the inverse of a quarter of the natural frequency of MEMS switch 12 when it is in its soft closed state. The amount of energy dissipated during the relaxing time depends on the length of the relaxing time. If the relaxing time is relatively brief, the amount of mechanical energy dissipated from the cantilever 16 will be relatively small. As a result, the time between t4 and a time t5 referred to herein as a settling time will need to be relatively longer, but just long enough for a significant portion of the remaining mechanical energy to dissipate.

The actuation signal voltage is decreased at a relatively slower rate between the time t5 and a time t6, which is referred to herein as the ramp-down time. The relatively slow rate of decrease of the actuator signal voltage limits the momentum of the cantilever 16 as the cantilever contact 22 moves away from the contact portion 24 of the second conductive pad 26 and towards the first position of the MEMS switch 12. In particular, decreasing the actuation signal from the third state to the first state is achieved using a third linear voltage ramp having a second negative slope. The second negative slope is predetermined to reduce ringing as the cantilever 16 moves from the third position to the first position. In one embodiment, the second negative slope has a transition time that is not less than the inverse of one quarter of a natural mechanical frequency of the cantilever 16 in its open state as the cantilever 16 moves from the third position to the first position. The magnitude of the second negative slope can be less than the magnitude of the first negative slope or the magnitude of the first negative slope and the magnitude of the second negative slope can be equal depending on constraints that result from the mechanical properties of the cantilever 16. At the time t6, the cantilever 16 settles to the first position and a new close and open cycle is ready to commence.

Figure 5:
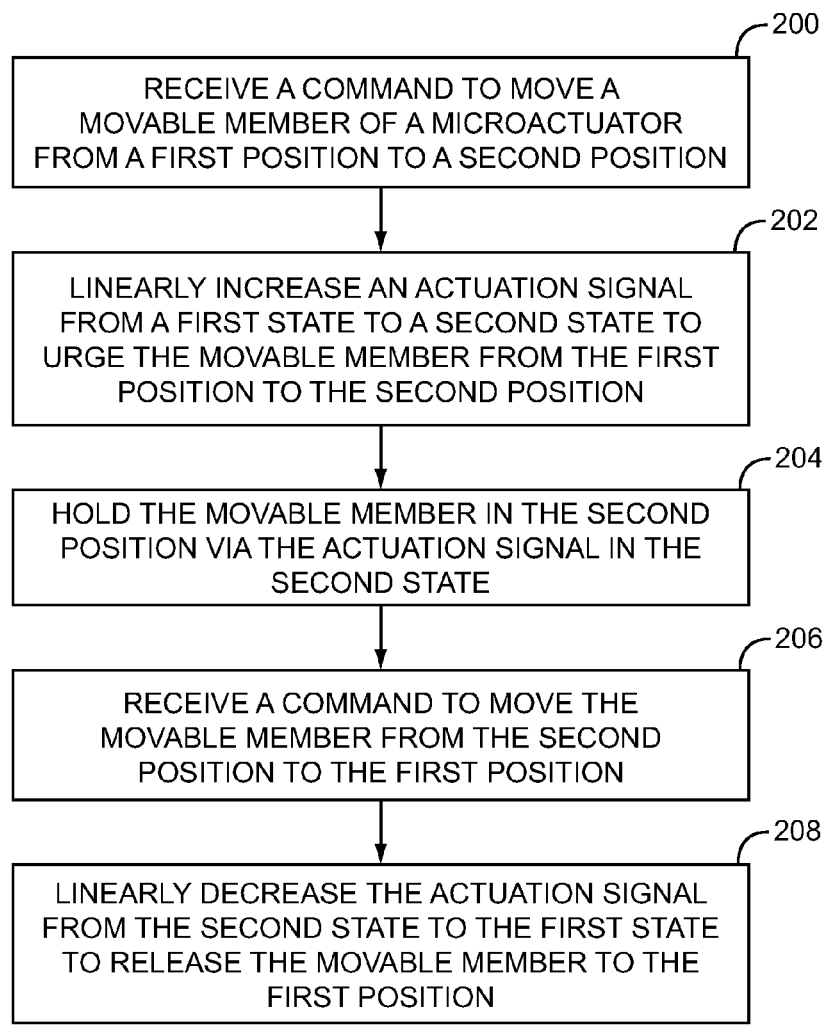
FIG. 5 is a flow diagram illustrating yet another a method that provides an actuation signal according to another embodiment of the present disclosure.

With reference to FIG. 5, yet another method is provided for providing an appropriate actuation signal to use when closing the active MEMS switches 12R1, 12R2, 12T1, and 12T2. In particular, the yet another method provides for linearly increasing the actuation such that bouncing is minimized using a first linear voltage ramp having a positive slope with a magnitude defined by a rise which is a difference between the second signal state and the first signal state and a run which is a difference between a time that a predetermined application requires for the movable member to nearly reach the second position and the start of the linear voltage ramp. In the following operational example, a movable member is the cantilever 16 (FIG. 1) of a microactuator that is a selected one of the active MEMS switches 12R1, 12R2, 12T1, and 12T2.

The following discussion refers to the operation of the MEMS switch 12 depicted in FIGS. 1A and 1B. However, it is to be understood that the actuation signal of the present disclosure is usable to actuate MEMS microactuators of types other than the MEMS switch 12. Other types of MEMS microactuators include but are not limited to MEMS capacitors and microscopic servomechanisms. The movable member of the MEMS switch 12 is the cantilever 16, whereas the movable member of a MEMS capacitor is typically a deflectable capacitor plate that has a first position for minimum capacitance and a second position for maximum capacitance. The movable member of a microscopic servomechanism is typically a servo arm having a first position that is a retracted position and a second position that is an extended position.

In operation, the switch control circuitry 44 (FIG. 2) will receive a command from the control system 50 (FIG. 2) to move the movable member (e.g., cantilever 16 FIGS. 1A and 1B) of the microactuator (e.g., MEMS switch 12 FIGS. 1A and 1B) from a first position to a second position (step 200). In response to the command, the switch control circuitry 44 linearly increases an actuation signal from a first state to a second state to urge the movable member from the first position to the second position (step 202). The movable member is then held in the second position via the actuation signal in the second state (step 204).

At some point, the switch control circuitry 44 will receive a command to move the movable member from the second position to the first position (step 206). In response to this command, the switch controller linearly decreases the actuation signal from the second state to the first state to release the movable member to the first position (step 208). The rate of decrease is relatively slow so that the energy stored in the movable member and the microactuator will be sufficiently dissipated. In at least one embodiment, the rate of decrease has a transition time that is not less than the inverse of one quarter of a natural mechanical frequency of the movable member in its open or relaxed state as the movable member moves from the second position to the first position.

Figure 6:
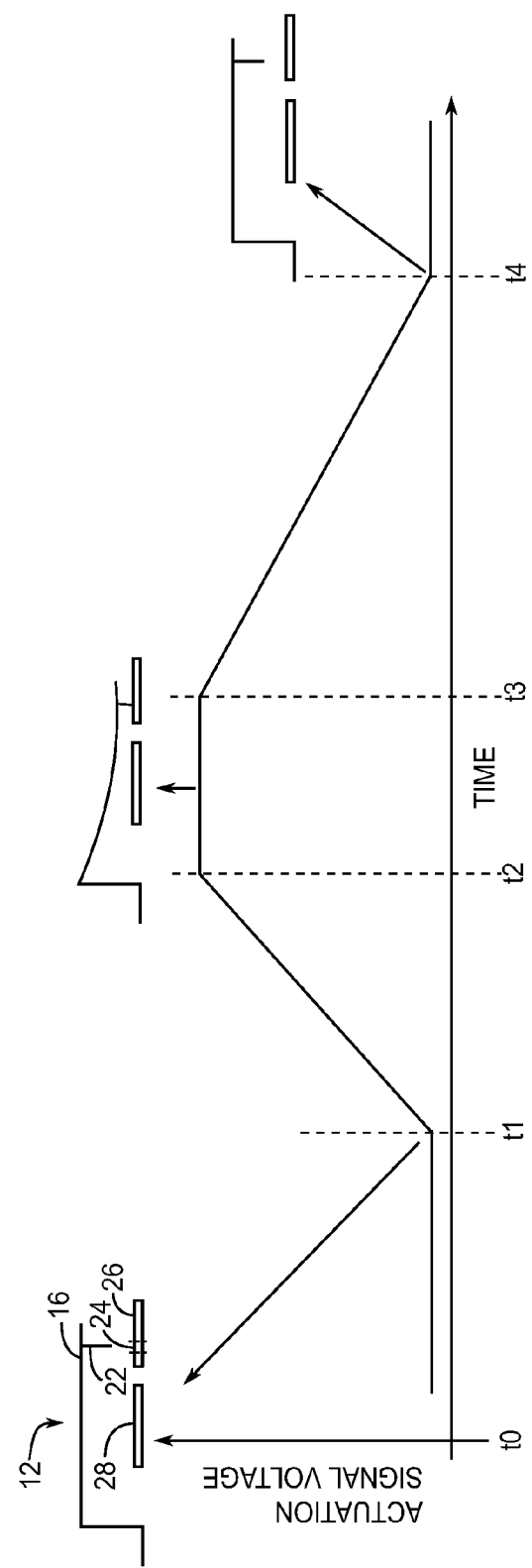
FIG. 6 is a graph of voltage versus time for the actuation signal in response to the method described in the flow diagram of FIG. 5.

The method disclosed by FIG. 5 allows the actuation signal to have a trapezoid shape as shown in FIG. 6. It is also important to understand that while all practical square waves can be considered to have a trapezoid shape, the goal of the actuation signal of the present disclosure is to minimize the number and duration of bounces of the MEMS switch 12 in the closed state and to minimize the number and duration of rings of the MEMS switch 12 in the open state by choosing deliberate slopes for both rising and falling edges of the actuation signal. Thus the ramp-up time and the ramp-down time of the actuator signal cannot be arbitrary. Instead, the ramp-up time and the ramp-down time are arrived at by taking into account the mechanical properties of the movable member and the environment surrounding the movable member, and the switching time specification called for by the predetermined application in which the MEMS switch 12 is to be used.

In particular, FIG. 6 is a graph of voltage versus time for the actuation signal in response to the method described in the flow diagram of FIG. 5. Symbols representing states of the MEMS switch 12 in response to the actuation signal are depicted above the graph in FIG. 6. It is to be understood that MEMS switch 12 is used for illustrative purposes and that other types of microactuators will respond similarly to the actuation signal of the present disclosure.

At a time t0, the voltage of the actuation signal is near zero and the MEMS switch 12 is in a first position, which in this case is an open position wherein the cantilever 16 does not store any appreciable mechanical energy. The voltage of the actuation signal linearly increases at a relatively slow rate that ranges from about one microsecond to about 100 microseconds between a time t1 and a time t2. The period between the time t1 and the time t2 is referred to as the ramp-up time of the actuation signal. A rate of increase in the actuation signal is a positive slope with the lowest possible magnitude which will ensure full compliance with the predetermined application specification in the time allotted by that specification as the movable member moves from a first position to the second position.

At the end of the ramp-up time at time t2, the cantilever 16 is in the second position which brings the cantilever contact 22 firmly against the contact portion 24 of the second conductive pad 26. The actuation signal is now in the second state which voltage at least above and preferably significantly above the voltage needed to just achieve contact. This extra voltage provides extra force to hold the two portions together firmly. At this point the MEMS switch 12 is in firm contact, which is illustrated by a relatively deep arc of the cantilever 16. It is important to note that the MEMS switch 12 is not drawn to scale. Therefore, movable members such as the cantilever 16 may have more or less deflection for firm contact and still be within the scope of the present disclosure.

The ramp-up time is proportional to a "switch on" time and is inversely proportional to a momentum of the cantilever 16. In one embodiment, the ramp-up time is around 20 μS. Other ramp-up times can be shorter or longer depending upon the mechanical characteristics of the MEMS switch 12 and the requirement of a predetermined application for the MEMS switch or micro-actuator. For example, the mechanical stiffness of the cantilever 16 may be different for different embodiments of the MEMS switch 12. Also, different embodiments may hermetically seal the MEMS switch 12 in various gas environments that have differing influences on mechanical damping of the cantilever 16.

During a time period between the time t2 and a time t3, the actuator signal maintains a voltage needed to hold the cantilever contact 22 in firm contact with the contact portion 24 of the second conductive pad 26. Typically, the mechanical energy stored in the cantilever 16 will be at a maximum while the cantilever contact 22 is in firm contact with the contact portion 24 of the second conductive pad 26. As a result of the mechanical energy stored in the cantilever 16, an abrupt and significant decrease in the voltage of the actuation signal to release the cantilever 16 to the open position of the MEMS switch 12 will generate an undesirable ringing displacement of the cantilever 16.

The actuation signal voltage is decreased at a relatively slow rate between the time t3 and a time t4, which is referred to herein as the ramp-down time. The relatively slow rate of decrease of the actuator signal voltage reduces the momentum of the cantilever 16 as the cantilever contact 22 moves away from the contact portion 24 of the second conductive pad 26 and towards the first position of the MEMS switch 12. In particular, decreasing the actuation signal from the second state to the first state is achieved using a linear voltage ramp having a negative slope. The negative slope is predetermined to reduce ringing as the cantilever 16 moves from the second position to the first position. In one embodiment, the negative slope has a transition time that is not less than the inverse of one quarter of a natural mechanical frequency of the cantilever 16 in its open state as the cantilever 16 moves from the second position to the first position. At the time t4, the cantilever 16 settles to the first position and a new close and open cycle is ready to commence.

Those skilled in the art will recognize improvements and modifications to the preferred embodiments of the present disclosure. All such improvements and modifications are considered within the scope of the concepts disclosed herein and the claims that follow.

What is claimed is:

1. A method of controlling positioning of a movable member of a MEMS microactuator relative to a fixed member fixed to a substrate on which the MEMS microactuator resides while suppressing bouncing and ringing of the movable member comprising:
   linearly increasing an actuation signal from a first state to a second state using a first linear voltage ramp with a positive slope to urge the movable member from a first position to a second position;
   holding the movable member in the second position with the actuation signal in the second state;
   linearly decreasing the actuation signal from the second state to a third state using a second linear voltage ramp having a first negative slope to release the movable member to a third position;
   holding the movable member in the third position with the actuation signal in the third state; and
   linearly decreasing the actuation signal from the third state using a third linear ramp voltage having a second negative slope to the first state to release the movable member to the first position.

2. The method of claim 1 wherein the second negative slope has a transition time that is not less than an inverse of one quarter of a natural mechanical frequency of the movable member in the first position as the movable member moves from the third position to the first position.

3. The method of claim 1 wherein a magnitude of the positive slope and a magnitude of the second negative slope are not equal.

4. The method of claim 1 wherein a magnitude of the positive slope and a magnitude of the first negative slope, and a magnitude of the second negative slope are equal.

5. The method of claim 1 wherein the MEMS microactuator is a MEMS switch that is open when the movable member is in the first position, and closed when the movable member is in the second position.

6. A system for controlling positioning of a movable member of a MEMS microactuator to reduce bouncing and ringing comprising:
   MEMS microactuator having a movable member relative to a fixed member fixed to a substrate on which the MEMS microactuator resides; and
   control circuitry in communication with the MEMS microactuator and adapted to:
      linearly increase an actuation signal from a first state to a second state using a first linear voltage ramp having a positive slope to urge the movable member from a first position to a second position;
      hold the movable member in the second position with the actuation signal in the second state;
      linearly decrease the actuation signal from the second state to a third state using a second linear voltage ramp having a first negative slope to release the movable member to a third position;
      hold the movable member in the third position with the actuation signal in the third state; and
      linearly decrease the actuation signal from the third state using a third linear voltage ramp having a second negative slope to the first state to release the movable member to the first position.

7. The system of claim 6 wherein a magnitude of the positive slope and a magnitude of the second negative slope are not equal.

8. The method of claim 6 wherein a magnitude of the positive slope and a magnitude of the first negative slope and a magnitude of the second negative slope are equal.

9. The system of claim 6 wherein a magnitude of the first negative slope and a magnitude of the second negative slope are predetermined to reduce ringing as the movable member moves from the second position to the third position and then from the third position to the first position.

10. The system of claim 9 wherein the second negative slope has a transition time that is not less than an inverse of one quarter of a natural mechanical frequency of the movable member in the first position as the movable member moves from the third position to the first position.

11. The system of claim 6 wherein the MEMS microactuator is a MEMS switch that is open when the movable member is in the first position, and closed when the movable member is in the second position.

12. A control circuit for controlling positioning of a movable member of a MEMS microactuator relative to a fixed member fixed to a substrate on which the MEMS microactuator resides while suppressing bouncing and ringing of the movable member, the control circuit comprising;
    an output adapted to:
        linearly increase an actuation signal from a first state to a second state using a first linear voltage ramp having a positive slope to urge the movable member from a first position to a second position;
        hold the movable member in the second position with the actuation signal in the second state;
        linearly decrease the actuation signal from the second state to a third state using a second linear voltage ramp having a first negative slope to release the movable member to a third position;
        hold the movable member in the third position with the actuation signal in the third state; and
        linearly decrease the actuation signal from the third state to the first state using a third linear voltage ramp having a second negative slope to release the movable member to the first position.

13. The control circuit of claim 12 wherein a magnitude of the first negative slope and a magnitude of the second negative slope are predetermined to reduce ringing as the movable member moves from the second position to the third position, and then from the third position to the first position.

14. The control circuit of claim 13 wherein the second negative slope has a transition time that is not less than an inverse of one quarter of a natural mechanical frequency of the movable member in the first position as the movable member moves from the third position to the first position.

15. The control circuit of claim 12 wherein the MEMS microactuator is a MEMS switch that is open when the movable member is in the first position, and closed when the movable member is in the second position.

16. A method of controlling positioning of a movable member of a MEMS microactuator relative to a fixed member fixed to a substrate on which the MEMS microactuator resides while suppressing ringing of the movable member comprising:
    linearly increasing an actuation signal from a first state to a second state using a first linear voltage ramp having a positive slope to urge the movable member from a first position to a second position;
    holding the movable member in the second position with the actuation signal in the second state;
    linearly decreasing the actuation signal from the second state to a third state using a second linear voltage ramp having a first negative slope to release the movable member to a third position;
    holding the movable member in the third position with the actuation signal in the third state; and
    linearly decreasing the actuation signal from the third state to the first state using a third linear voltage ramp having a second negative slope to release the movable member to the first position.

17. The method of claim 16 wherein the first negative slope has a transition time that is not less than an inverse of one quarter of a natural mechanical frequency of the movable member in the third position as the movable member moves from the second position to the third position.

18. The method of claim 16 wherein the second negative slope is predetermined to reduce ringing as the movable member moves from the third position to the first position.

19. The method of claim 18 wherein the second negative slope has a transition time that is not less than an inverse of one quarter of a natural mechanical frequency of the movable member in the first position as the movable member moves from the third position to the first position.

20. The method of claim 19 wherein the second negative slope has a magnitude that is less than the first negative slope.

21. The method of claim 19 wherein the first negative slope and the second negative slope are equal.

22. The method of claim 16 wherein the MEMS microactuator is a MEMS switch that is open when the movable member is in the first position, firmly closed in the second position, and softly closed in the third position.

* * * * *